US008206894B2

(12) United States Patent
Abe et al.

(10) Patent No.: US 8,206,894 B2

(45) Date of Patent: Jun. 26, 2012

(54) RESIST PATTERN-FORMING METHOD AND RESIST PATTERN MINIATURIZING RESIN COMPOSITION

(76) Inventors: Takayoshi Abe, Tokyo (JP); Atsushi Nakamura, Tokyo (JP); Gouji Wakamatsu, Tokyo (JP)

( * ) Notice: Subject to any disclaimer, the term of this patent is extended or adjusted under 35 U.S.C. 154(b) by 71 days.

(21) Appl. No.: 12/841,988

(22) Filed: Jul. 22, 2010

(65) Prior Publication Data

US 2010/0310988 A1 Dec. 9, 2010

Related U.S. Application Data

(63) Continuation of application No. PCT/JP2009/051072, filed on Jan. 23, 2009.

(30) Foreign Application Priority Data

Jan. 24, 2008 (JP) ................................ 2008-013757

(51) Int. Cl.
*G03F 7/00* (2006.01)
*G03F 7/004* (2006.01)
*G03F 7/26* (2006.01)
*G03F 7/40* (2006.01)

(52) U.S. Cl. ..................... 430/312; 430/270.1; 430/322; 430/330; 430/331; 430/905

(58) Field of Classification Search ............... 430/270.1, 430/312, 330, 331, 905
See application file for complete search history.

(56) References Cited

U.S. PATENT DOCUMENTS 7,378,229 B2 * 5/2008 Endo et al. .................... 430/322
7,781,142 B2 * 8/2010 Chiba et al. ................ 430/270.1
2005/0202351 A1 * 9/2005 Houlihan et al. ............. 430/322
2007/0259287 A1 * 11/2007 Sakakibara et al. ....... 430/270.1
2008/0311530 A1 * 12/2008 Allen et al. ................... 430/327
2009/0253080 A1 * 10/2009 Dammel et al. .............. 430/324
2009/0274980 A1 * 11/2009 Kang et al. .................... 430/311
2010/0047712 A1 * 2/2010 Khojasteh et al. .......... 430/272.1
(Continued)

FOREIGN PATENT DOCUMENTS

JP 04-071222 3/1992
(Continued)

OTHER PUBLICATIONS

International Search Report for corresponding International Application No. PCT/JP2009/051072, Feb. 17, 2009.
(Continued)

*Primary Examiner* — Amanda C. Walke
(74) *Attorney, Agent, or Firm* — Ditthavong Mori & Steiner, P.C.

(57) ABSTRACT

A resist pattern-forming method includes forming a first resist pattern using a first positive-tone radiation-sensitive resin composition. A resist pattern-miniaturizing resin composition is applied to the first resist pattern. The resist pattern-miniaturizing resin composition applied to the first resist pattern is baked and developed to form a second resist pattern that is miniaturized from the first resist pattern. A resist pattern-insolubilizing resin composition is applied to the second resist pattern. The resist pattern-insolubilizing resin composition applied to the second resist pattern is baked and washed to form a third resist pattern that is insoluble in a developer and a second positive-tone radiation-sensitive resin composition. A second resist layer is formed on the third resist pattern using the second positive-tone radiation-sensitive resin composition. The second resist layer is exposed and developed to form a fourth resist pattern.

11 Claims, 1 Drawing Sheet

U.S. PATENT DOCUMENTS

| | | | | |
|---|---|---|---|---|
| 2010/0068650 | A1* | 3/2010 | Nishimura et al. | 430/280.1 |
| 2010/0183851 | A1* | 7/2010 | Cao et al. | 428/195.1 |
| 2010/0183857 | A1* | 7/2010 | Nouvelot et al. | 428/213 |
| 2010/0266953 | A1* | 10/2010 | Chiba et al. | 430/270.1 |
| 2011/0305979 | A1* | 12/2011 | Harada et al. | 430/5 |

FOREIGN PATENT DOCUMENTS

| | | |
|---|---|---|
| JP | 2001-281886 | 10/2001 |
| JP | 2006-193687 | 7/2006 |
| JP | 2006-307179 | 11/2006 |
| WO | WO 2005/116776 | 12/2005 |
| WO | WO 2008/114644 | 9/2008 |

OTHER PUBLICATIONS

International Preliminary Report on Patentability and a Written Opinion for corresponding International Application No. PCT/JP2009/051072, Aug. 31, 2010.

Vanleenhove et al., "A litho-only approach to double patterning" SPIE, 2007, pp. 1-10, vol. 6520, XP-002565386.

* cited by examiner

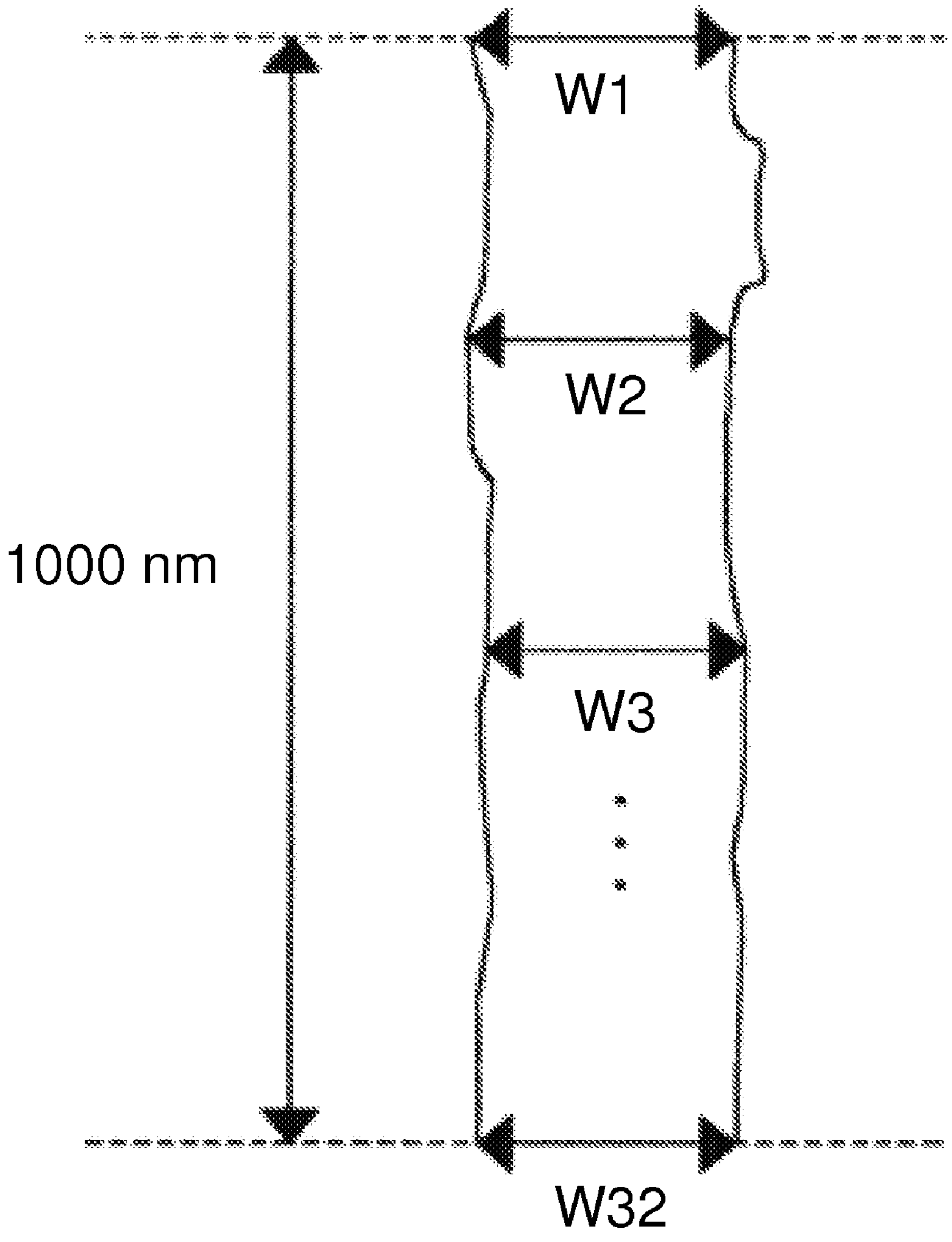
W1
W2
1000 nm
W3
W32

RESIST PATTERN-FORMING METHOD AND RESIST PATTERN MINIATURIZING RESIN COMPOSITION

CROSS-REFERENCE TO RELATED APPLICATIONS

The present application is a continuation application of International Application No. PCT/JP2009/051072, filed Jan. 23, 2009, which claims priority to Japanese Patent Application No. 2008-013757, filed Jan. 24, 2008. The contents of these applications are incorporated herein by reference in their entirety.

BACKGROUND OF THE INVENTION

1. Field of the Invention

The present invention relates to a resist pattern-forming method and a resist pattern-miniaturizing resin composition.

2. Discussion of the Background

Along with an increase in the degree of integration of semiconductor devices, a reduction in dimensions (line width) of interconnects has been increasingly desired for a semiconductor device production process. A fine pattern has been formed by forming a resist pattern on the surface of a substrate (e.g., silicon wafer) provided with a thin film by utilizing photolithographic technology, and etching the thin film using the resist pattern as a mask.

Therefore, photolithographic technology is very important when forming a fine resist pattern. Photolithographic technology involves resist application, mask alignment, exposure, and development. It is effective to reduce the exposure wavelength in order to form a fine resist pattern. However, it is very expensive to update the exposure system, and a resist material that deals with a shorter wavelength may not be available. Moreover, a reduction in exposure wavelength is limited.

A resist pattern-miniaturizing resin composition that contains an acidic water-soluble resin, and a method that reduces the line width of a positive-tone chemically amplified resist pattern using the resist pattern-miniaturizing resin composition have been disclosed (e.g., Japanese Patent Application Publication (KOKAI) No. 2001-281886).

SUMMARY OF THE INVENTION

According to one aspect of the present invention, a resist pattern-forming method includes forming a first resist pattern using a first positive-tone radiation-sensitive resin composition. A resist pattern-miniaturizing resin composition is applied to the first resist pattern. The resist pattern-miniaturizing resin composition applied to the first resist pattern is baked and developed to form a second resist pattern that is miniaturized from the first resist pattern. A resist pattern-insolubilizing resin composition is applied to the second resist pattern. The resist pattern-insolubilizing resin composition applied to the second resist pattern is baked and washed to form a third resist pattern that is insoluble in a developer and a second positive-tone radiation-sensitive resin composition. A second resist layer is formed on the third resist pattern using the second positive-tone radiation-sensitive resin composition. The second resist layer is exposed and developed to form a fourth resist pattern.

According to another aspect of the present invention, a resist pattern-miniaturizing resin composition includes a fluorine-containing resin that is soluble in an alkaline solution, and a non-aqueous solvent. The resist pattern-miniaturizing resin composition is used in the above described resist pattern-forming method.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic view showing a line pattern.

DESCRIPTION OF THE EMBODIMENTS

The embodiments will now be described with reference to the accompanying drawings, wherein like reference numerals designate corresponding or identical elements throughout the various drawings.

Note that the expression “resist pattern miniaturization” used herein refers to reducing the line width of a resist pattern that has been formed to form a resist pattern having a reduced line width.

I. Resist Pattern-Forming Method

A resist pattern-forming method according to one embodiment of the invention includes (1) forming a first resist pattern using a first positive-tone radiation-sensitive resin composition (hereinafter may be referred to as “step (1)”), (2) applying a resist pattern-miniaturizing resin composition to the first resist pattern, and baking and developing the resist pattern-miniaturizing resin composition to form a second resist pattern that is miniaturized from the first resist pattern (hereinafter may be referred to as “step (2)”), (3) applying a resist pattern-insolubilizing resin composition to the second resist pattern, and baking and washing the resist pattern-insolubilizing resin composition to form a third resist pattern that is insoluble in a developer and a second positive-tone radiation-sensitive resin composition (hereinafter may be referred to as “step (3)”), and (4) forming a second resist layer on the third resist pattern using the second positive-tone radiation-sensitive resin composition, and exposing and developing the second resist layer to form a fourth resist pattern (hereinafter may be referred to as “step (4)”). The resist pattern-forming method may be suitably used to form a fine resist pattern having a line width of 50 nm or less using an ArF excimer laser.

1. Step (1)

The first resist pattern is formed in the step (1). Specifically, a first resist layer that is formed on a substrate using the first positive-tone radiation-sensitive resin composition is selectively exposed through a mask, and developed to form the first resist pattern.

More specifically, an anti-reflective film (organic film or inorganic film) is formed on an 8-inch or 12-inch silicon wafer substrate by spin coating or the like. The first positive-tone radiation-sensitive resin composition is applied to the substrate by spin coating or the like, and prebaked (PB) (e.g., at 80 to 140° C. for 60 to 120 seconds) to form the first resist layer. The first resist layer is selectively exposed to ultraviolet rays (e.g., g-line or i-line), KrF excimer laser light, ArF excimer laser light, X-rays, electron beams, or the like through a mask, subjected to post-exposure bake (PEB) (e.g., at 80 to 140° C.), and developed using a 2.38 mass % tetramethylammonium hydroxide aqueous solution to form the first resist pattern.

First Positive-Tone Radiation-Sensitive Resin Composition

The first positive-tone radiation-sensitive resin composition normally includes an acid-dissociable group-containing resin, and an acid generator. The first positive-tone radiation-sensitive resin composition preferably further includes an acid diffusion controller. The first positive-tone radiation-sensitive resin composition that includes the acid-dissociable group-containing resin is insoluble or scarcely soluble in alkali, but becomes alkali-soluble due to an acid. Specifically, the acid-dissociable group dissociates due to an acid generated by the acid generator upon exposure so that only the exposed area exhibits high solubility in an alkaline developer (i.e., becomes alkali-soluble). Therefore, only the exposed area of the resist is dissolved in and removed by the alkaline developer to obtain a positive-tone resist pattern. The expression "insoluble or scarcely soluble in alkali" means that a film that is formed only of a resist material (defined later) and is not exposed has a thickness equal to or more than 50% of the initial thickness when developed under development conditions employed when forming the first resist pattern. The term "alkali-soluble" means that a film that is formed only of the resist composition and is not exposed has a thickness less than 50% of the initial thickness when developed in the same manner as described above. The term "acid-dissociable group" refers to a group that has an alkali-soluble moiety that is protected by a protecting group, and is insoluble or scarcely soluble in alkali until the protecting group is eliminated due to an acid.

The first positive-tone radiation-sensitive resin composition may be prepared by dissolving each component in a solvent to prepare a homogenous solution, and filtering the solution through a filter having a pore size of about 0.2 μm, for example. Additives such as a surfactant, a sensitizer, and an aliphatic additive may optionally be added to the first positive-tone radiation-sensitive resin composition.

Acid-Dissociable Group-Containing Resin

The acid-dissociable group-containing resin is preferably an alicyclic radiation-sensitive resin that is sensitive to ArF excimer laser light, and more preferably a resin that includes a repeating unit shown by the following general formula (3) (hereinafter may be referred to as "resist material"). The first positive-tone radiation-sensitive resin composition that includes the acid-dissociable group-containing resin becomes alkali-soluble due to an acid generated upon exposure.

(3)

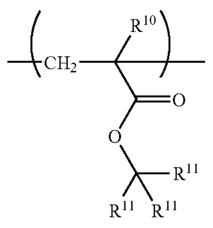

wherein $R^{10}$ represents a hydrogen atom or a methyl group, each of $R^{11}$ represents at least one of a monovalent alicyclic hydrocarbon group having 4 to 20 carbon atoms, a derivative thereof, and a linear or branched alkyl group having 1 to 4 carbon atoms, or two of $R^{11}$ form a divalent alicyclic hydrocarbon group having 4 to 20 carbon atoms or a derivative thereof together with the carbon atom that is bonded thereto, and another $R^{11}$ other than the two of $R^{11}$ represents a linear or branched alkyl group having 1 to 4 carbon atoms, a monovalent alicyclic hydrocarbon group having 4 to 20 carbon atoms, or a derivative thereof.

Specific examples of the monovalent alicyclic hydrocarbon group having 4 to 20 carbon atoms represented by $R^{11}$ in the general formula (3) include a group that includes an alicyclic ring derived from a cycloalkane (e.g., norbornane, tricyclodecane, tetracyclododecane, adamantane, cyclobutane, cyclopentane, cyclohexane, cycloheptane, or cyclooctane); a group obtained by substituting the above group with at least one linear, branched, or cyclic alkyl group having 1 to 4 carbon atoms (e.g., methyl group, ethyl group, n-propyl group, i-propyl group, n-butyl group, 2-methylpropyl group, 1-methylpropyl group, or t-butyl group); and the like. Among these, a group that includes an alicyclic ring derived from norbornane, tricyclodecane, tetracyclododecane, adamantane, cyclopentane, or cyclohexane, or a group obtained by substituting the above group with at least one linear, branched, or cyclic alkyl group having 1 to 4 carbon atoms is preferable.

Specific examples of derivatives of the monovalent alicyclic hydrocarbon group having 4 to 20 carbon atoms represented by $R^{11}$ in the general formula (3) include monovalent alicyclic hydrocarbon groups having 4 to 20 carbon atoms that have at least one substituent selected from a hydroxyl group; a carboxyl group; an oxo group (=O), hydroxyalkyl groups having 1 to 4 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, and a 4-hydroxybutyl group; alkoxy groups having 1 to 4 carbon atoms such as a methoxy group, an ethoxy group, an n-propoxy group, an i-propoxy group, an n-butoxy group, a 2-methylpropoxy group, a 1-methylpropoxy group, and a t-butoxy group; a cyano group; cyanoalkyl groups having 2 to 5 carbon atoms such as a cyanomethyl group, a 2-cyanoethyl group, a 3-cyanopropyl group, and a 4-cyanobutyl group; and the like. Among these, a monovalent alicyclic hydrocarbon group having 4 to 20 carbon atoms that has at least one substituent selected from a hydroxyl group, a carboxyl group, a hydroxymethyl group, a cyano group, and a cyanomethyl group is preferable.

Specific examples of the linear or branched alkyl group having 1 to 4 carbon atoms represented by $R^{11}$ in the general formula (3) include a methyl group, an ethyl group, an n-propyl group, an i-propyl group, an n-butyl group, a 2-methylpropyl group, a 1-methylpropyl group, a t-butyl group, and the like. Among these, a methyl group and an ethyl group are preferable.

Specific examples of the divalent alicyclic hydrocarbon group having 4 to 20 carbon atoms or a derivative thereof formed by two of $R^{11}$ in the general formula (3) together with the carbon atom that is bonded thereto include the divalent alicyclic hydrocarbon groups having 4 to 20 carbon atoms and the derivatives thereof illustrated above for $R^{11}$.

The group shown by "$-COOC(R^{11})_3$" in the general formula (3) is the acid-dissociable group that dissociates due to an acid and forms a carboxyl group. The carboxyl group becomes an anion due to alkali. The resist material thus becomes alkali-soluble.

Specific examples of the group shown by "$-C(R^{11})_3$" in the general formula (3) include groups shown by the following general formulas (4a) to (4f).

(4a)

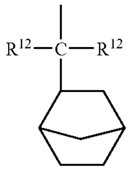

(4b)

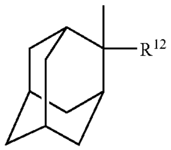

(4c)

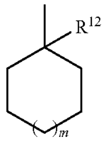

(4d)

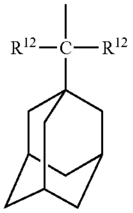

(4e)

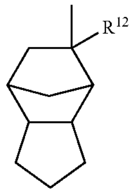

(4f)

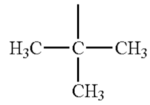

wherein each of $R^{12}$ represents at least one of a linear or branched alkyl group having 1 to 4 carbon atoms, and m is 0 or 1. $R^{12}$ may be different or the same.

Specific examples of the linear or branched alkyl group having 1 to 4 carbon atoms represented by $R^{12}$ in the general formula (4a) to (40 include a methyl group, an ethyl group, an n-propyl group, an i-propyl group, an n-butyl group, a 2-methylpropyl group, a 1-methylpropyl group, a t-butyl group, and the like. Among these, a methyl group and an ethyl group are preferable.

Acid Generator

The acid generator preferably has a structure shown by the following general formula (5). The first positive-tone radiation-sensitive resin composition that includes the acid generator is decomposed upon exposure, and generates an acid.

(5)

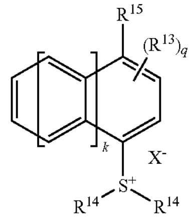

wherein $R^{13}$ represents a linear or branched alkyl group having 1 to 10 carbon atoms, a linear or branched alkoxy group having 1 to 10 carbon atoms, or a linear, branched, or cyclic alkanesulfonyl group having 1 to 10 carbon atoms, each of $R^{14}$ represents at least one of a linear or branched alkyl group having 1 to 10 carbon atoms, a substituted or unsubstituted phenyl group, and a substituted or unsubstituted naphthyl group, or $R^{14}$ bond to form a substituted or unsubstituted divalent group having 2 to 10 carbon atoms, $R^{15}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, k is an integer from 0 to 2, $X^-$ represents an anion having a structure shown by the following general formula (6), and q is an integer from 0 to 10.

$$R^{16}C_nF_{2n}SO_3^- \quad (6)$$

wherein $R^{16}$ represents a fluorine atom or a substituted or unsubstituted hydrocarbon group having 1 to 12 carbon atoms, and n is an integer from 1 to 10.

The acid generator is preferably used in an amount of 0.1 to 20 parts by mass, more preferably 0.5 to 10 parts by mass, and particularly preferably 5 to 10 parts by mass, based on 100 parts by mass of the first positive-tone radiation-sensitive resin composition, from the viewpoint of ensuring sensitivity and developability. If the amount of the acid generator is less than 0.1 parts by mass, sensitivity and developability may decrease. If the amount of the acid generator is more than 20 parts by mass, transparency to radiation may decrease. This may make it difficult to form a rectangular resist pattern.

The acid generators having a structure shown by the general formula (5) may be used either individually or in combination.

The first positive-tone radiation-sensitive resin composition may include an additional acid generator other than the acid generator having a structure shown by the general formula (5). Specific examples of the additional acid generator include onium salt compounds, halogen-containing compounds, diazoketone compounds, sulfone compounds, sulfonic acid compounds, and the like. The additional acid generators may be used either individually or in combination. The first positive-tone radiation-sensitive resin composition may include the acid generator having a structure shown by the general formula (5) and the additional acid generator in combination.

The additional acid generator is normally used in an amount of 80 mass % or less, preferably 60 mass % or less, and more preferably 50 mass % or less, based on the total amount of the acid generators.

Acid Diffusion Controller

The first positive-tone radiation-sensitive resin composition preferably includes an acid diffusion controller. The acid diffusion controller controls a phenomenon wherein an acid generated by the acid generator upon exposure is diffused in the first resist layer, and suppresses undesired chemical reactions in the unexposed area. The acid diffusion controller improves the storage stability and the resolution of the first positive-tone radiation-sensitive resin composition. Moreover, a change in line width of the resist pattern due to a change in post-exposure delay (PED) from exposure can be prevented so that a composition with remarkably superior process stability can be obtained. A nitrogen-containing organic compound or a photodegradable base is preferably used as the acid diffusion controller.

The acid diffusion controller is preferably used in an amount of 15 parts by mass or less, more preferably 10 parts by mass or less, and particularly preferably 15 parts by mass or less, based on 100 parts by mass of the first positive-tone radiation-sensitive resin composition. The lower limit of the amount of the acid diffusion controller is not particularly limited, but is normally 0.001 parts by mass or more. If the amount of the acid diffusion controller is more than 50 parts by mass, sensitivity may decrease. If the amount of the acid diffusion controller is less than 0.001 parts by mass, the shape or the dimensional accuracy of the resist pattern may decrease depending on the process conditions. The acid diffusion controllers may be used either individually or in combination.

Examples of the nitrogen-containing organic compound include compounds shown by the following general formula (7), compounds including two nitrogen atoms in the molecule, polyamino compounds including three or more nitrogen atoms in the molecule and a polymer thereof, amide group-containing compounds, urea compounds, nitrogen-containing heterocyclic compounds, and the like.

(7)

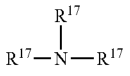

wherein each of $R^{17}$ represents at least one of a hydrogen atom, a substituted or unsubstituted linear, branched, or cyclic alkyl group, a substituted or unsubstituted aryl group, and a substituted or unsubstituted aralkyl group. $R^{17}$ may be different or the same.

The photodegradable base is an onium salt compound that generates a base that exhibits acid diffusion controllability upon decomposition due to exposure. Examples of the onium salt compound include sulfonium salt compounds shown by the following general formula (8) and iodonium salt compounds shown by the following general formula (9).

(8)

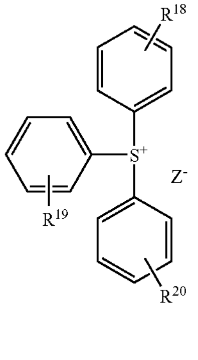

-continued (9)

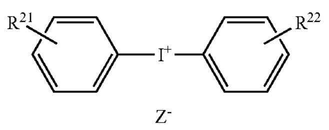

wherein each of $R^{18}$, $R^{19}$, and $R^{20}$ represents at least one of a hydrogen atom, an alkyl group, an alkoxy group, a hydroxyl group, and a halogen atom, each of $R^{21}$ and $R^{22}$ represents at least one of a hydrogen atom, an alkyl group, an alkoxy group, a hydroxyl group, and a halogen atom, and $Z^-$ represents $OH^-$, $R^{23}$—$COO^-$, $R^{23}$—$SO_3^-$ (wherein $R^{23}$ represents an alkyl group, an aryl group, or an alkaryl group), or an anion shown by the following general formula (10). $R^{18}$, $R^{19}$, and $R^{20}$ may be different or the same. $R^{21}$ and $R^{22}$ may be different or the same.

(10)

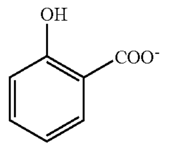

Solvent

The first positive-tone radiation-sensitive resin composition may be prepared by dissolving each component in a solvent, and applied to a substrate. The solvent is preferably at least one solvent selected from the group consisting of propylene glycol monomethyl ether acetate, 2-heptanone, and cyclohexanone (hereinafter may be referred to as "solvent (1)"). A solvent (hereinafter may be referred to as "additional solvent") other than the solvent (1) may also be used. It is also possible to use the solvent (1) and the additional solvent in combination.

The solvent is included in the first positive-tone radiation-sensitive resin composition in such an amount that the first positive-tone radiation-sensitive resin composition normally has a solid content of 2 to 70 mass %, preferably 4 to 25 mass %, and more preferably 4 to 10 mass %.

Examples of the additional solvent include linear or branched ketones, cyclic ketones, propylene glycol monoalkyl ether acetates, alkyl 2-hydroxypropionates, alkyl 3-alkoxypropionates, γ-butyrolactone, and the like. These solvents may be used either individually or in combination. When using the solvent (1) and the additional solvent in combination, the additional solvent is normally used in an amount of 50 mass % or less, preferably 30 mass % or less, and still more preferably 25 mass % or less, based on the total amount of the solvents.

2. Step (2)

The second resist pattern is formed in the step (2). Specifically, the resist pattern-miniaturizing resin composition is applied to the first resist pattern, baked, and developed to form the second resist pattern that is smaller than the first resist pattern. The details of the resist pattern-miniaturizing resin composition are described later in the section entitled "II. Resist pattern-miniaturizing resin composition".

More specifically, the resist pattern-miniaturizing resin composition is applied to the first resist pattern by spin coating or the like. The resist pattern-miniaturizing resin composition applied to the substrate is prebaked (PB) to form a pattern. The pattern thus formed is developed (e.g., for 60 to 120 seconds) using an alkaline developer (e.g., tetramethylammonium hydroxide aqueous solution) to dissolve and remove an alkali-soluble layer. The pattern is then washed with water to form the second resist pattern that is smaller than the first resist pattern.

An acid is diffused into the first resist pattern from the resist pattern-miniaturizing resin composition upon PB, and the acid-dissociable group-containing resin that is present in the first resist pattern undergoes a deprotection reaction due to the acid. An alkali-soluble layer is thus formed in the first resist pattern. The thickness of the alkali-soluble layer that is formed in the first resist pattern may be adjusted by appropriately changing the type of resist pattern-miniaturizing resin composition, the type of first positive-tone radiation-sensitive resin composition, the PB temperature, the PB time, etc. The PB temperature is normally 90 to 180° C., and the PB time is normally 60 to 120 seconds. The PB temperature is preferably 120 to 170° C. A cooling step may be performed after PB at 23° C. for 30 seconds.

An alkaline aqueous solution prepared by dissolving at least one alkaline compound selected from alkali metal salts (e.g., sodium hydroxide, potassium hydroxide, sodium carbonate, sodium silicate, and sodium metasilicate); ammonia; alkylamines (e.g., ethylamine, n-propylamine, diethylamine, di-n-propylamine, triethylamine, and methyldiethylamine); alkanolamines (e.g., dimethylethanolamine and triethanolamine); tetraalkylammonium hydroxides (e.g., tetramethylammonium hydroxide and tetraethylammonium hydroxide); choline, 1,8-diazabicyclo[5.4.0]-7-undecene, 1,5-diazabicyclo[4.3.0]-5-nonene, and the like in water, may be used as the alkaline developer. Among these, it is preferable to use a tetraalkylammonium hydroxide aqueous solution. An appropriate amount of water-soluble organic solvent (e.g., methanol or ethanol), surfactant, etc. may be added to the alkaline developer.

3. Step (3)

The third resist pattern is formed in the step (3) by processing the second resist pattern. Specifically, the resist pattern-insolubilizing resin composition is applied to the second resist pattern, prebaked, and washed to form the third resist pattern that is insoluble in the developer and the second positive-tone radiation-sensitive resin composition.

More specifically, the resist pattern-insolubilizing resin composition is applied to the second resist pattern by spin coating or the like. The resist pattern-insolubilizing resin composition applied to the substrate is prebaked (PB) (e.g., at 150° C. for 90 seconds) to form a pattern. The pattern thus formed is developed (e.g., for 60 to 120 seconds) using an alkaline developer (e.g., tetramethylammonium hydroxide aqueous solution), and washed with ultrapure water or the like to form the third resist pattern that is insoluble in the developer and the second positive-tone radiation-sensitive resin composition. The PB temperature is normally 90 to 180° C., and preferably 120 to 170° C. A cooling step may be performed after PB at 23° C. for 30 seconds.

Resist Pattern-Insolubilizing Resin Composition

The resist pattern-insolubilizing resin composition normally includes a hydroxyl group-containing resin, a crosslinking agent, and an alcohol organic solvent.

Hydroxyl group-containing resin

The hydroxyl group-containing resin includes a structural unit that includes a hydroxyl group (—OH) derived from at least one compound selected from alcohols, phenols, and carboxylic acids. The hydroxyl group-containing resin preferably further includes a repeating unit shown by the following general formula (11).

(11)

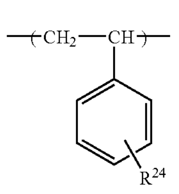

wherein $R^{24}$ represents a hydrogen atom, a linear or branched alkyl group having 1 to 8 carbon atoms, or a linear or branched alkoxy group having 1 to 8 carbon atoms.

The group represented by $R^{24}$ in the general formula (11) is preferably a t-butyl group, an acetoxy group, or a 1-ethoxyethoxy group, and more preferably a t-butyl group.

The repeating unit shown by the general formula (11) may be obtained by copolymerizing a styrene derivative (monomer). It is preferable to use t-butoxystyrene as the styrene derivative that forms the repeating unit shown by the general formula (11).

The resin that includes a structural unit that includes a hydroxyl group (—OH) derived from at least one compound selected from alcohols, phenols, and carboxylic acids may be obtained by copolymerizing a monomer component including a monomer that includes at least one hydroxyl group selected from an alcoholic hydroxyl group, a hydroxyl group derived from an organic acid (e.g., carboxylic acid), and a phenolic hydroxyl group. The monomer that includes at least one hydroxyl group is preferably a monomer that includes an amide bond (amide group) in the molecule, and more preferably a monomer shown by the following general formula (12).

(12)

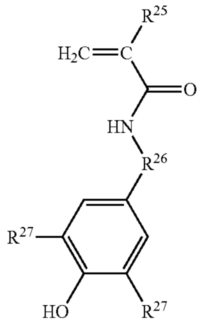

wherein each of $R^{25}$ and $R^{29}$ represents at least one of a hydrogen atom and a methyl group, and $R^{26}$ represents a single bond or a linear or cyclic divalent hydrocarbon group. $R^{25}$ and $R^{29}$ may be different or the same.

Specific examples of the linear or cyclic divalent hydrocarbon group represented by $R^{12}$ in the general formula (12) include chain-like hydrocarbon groups such as a methylene group, an ethylene group, a propylene group (e.g., 1,3-propylene group and 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a propylidene group, and a 2-propylidene group; monocyclic hydrocarbon groups such as a cycloalkylene group having 3 to 10 carbon atoms, such as a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group); bridged cyclic hydrocarbon groups such as a dicyclic to tetracyclic hydrocarbon group having 4 to 30 carbon atoms, such as a norbornylene group (e.g., 1,4-norbornylene group and 2,5-norbornylene group), and an admantylene group (e.g., 1,5-admantylene group and 2,6-admantylene group); and the like.

It is preferable to use p-hydroxymethacrylanilide as the monomer shown by the general formula (12). The monomer shown by the general formula (12) is normally used in an amount of 30 to 95 mol %, preferably 40 to 90 mol %, and more preferably 40 to 70 mol %, based on the total amount of the monomers that form the hydroxyl group-containing resin.

It is possible to copolymerize a monomer that includes a specific functional group that can be converted into a phenolic hydroxyl group after copolymerization (hereinafter may be referred to as "specific functional group-containing monomer"). Specific examples of the specific functional group-containing monomer include p-acetoxystyrene, α-methyl-p-acetoxystyrene, p-benzyloxystyrene, p-t-butoxystyrene, p-t-butoxycarbonyloxystyrene, p-t-butyldimethylsiloxystyrene, and the like. The specific functional group included in the resin obtained by copolymerizing the specific functional group-containing monomer may be easily converted into a phenolic hydroxyl group by an appropriate treatment (e.g., hydrolysis using hydrochloric acid). The specific functional group-containing monomer is normally used in an amount of 5 to 90 mol %, preferably 10 to 80 mol %, and more preferably 30 to 60 mol %, based on the total amount of the monomers that form the hydroxyl group-containing resin.

Crosslinking Agent

The crosslinking agent preferably includes a compound that includes a group shown by the following general formula (13) (hereinafter may be referred to as "crosslinking agent (1)") or a compound that includes two or more cyclic ethers as reactive groups (hereinafter may be referred to as "crosslinking agent (2)"). The crosslinking agent more preferably includes the crosslinking agent (1) and the crosslinking agent (2). The crosslinking agents may be used either individually or in combination.

(13)

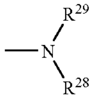

wherein each of $R^{28}$ and $R^{29}$ represents at least one of a hydrogen atom and a group shown by the following general formula (14) wherein at least one of $R^{28}$ and $R^{29}$ represents a group shown by the general formula (14).

(14)

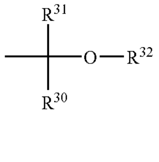

wherein each of $R^{30}$ and $R^{31}$ represents at least one of a hydrogen atom, an alkyl group having 1 to 6 carbon atoms, and an alkoxyalkyl group having 1 to 6 carbon atoms, or $R^{30}$ and $R^{31}$ bond to form a divalent alicyclic hydrocarbon group having 2 to 10 carbon atoms together with the carbon atom that is bonded thereto, and $R^{32}$ represents a hydrogen atom or an alkyl group having 1 to 6 carbon atoms. The group shown by the general formula (14) reacts with at least one of the hydroxyl group-containing resin or the crosslinking agent (1) due to an acid so that the hydroxyl group-containing resin is cured.

Specific examples of the crosslinking agent (1) include compounds that include a functional group such as an imino group, a methylol group, or a methoxymethyl group in the molecule. Specific examples of these compounds include nitrogen-containing compounds prepared by alkyl-etherification of all or some of the active methylol groups of (poly)methylolated melamine, (poly)methylolated glycoluril, (poly)methylolated benzoquanamine, (poly)methylolated urea, or the like. Examples of the alkyl group used for alkyl-etherification include a methyl group, an ethyl group, a butyl group, and a mixture thereof. The nitrogen-containing compound may include an oligomer component that is partially self-condensed. Specific examples of the nitrogen-containing compound include hexamethoxymethylated melamine, hexabutoxymethylated melamine, tetramethoxymethylated glycoluril, tetrabutoxymethylated glycoluril, and the like.

Examples of commercially available products of the compounds used as the crosslinking agent (1) include Cymel 300, Cymel 301, Cymel 303, Cymel 350, Cymel 232, Cymel 235, Cymel 236, Cymel 238, Cymel 266, Cymel 267, Cymel 285, Cymel 1123, Cymel 1123-10, Cymel 1170, Cymel 370, Cymel 771, Cymel 272, Cymel 1172, Cymel 325, Cymel 327, Cymel 703, Cymel 712, Cymel 254, Cymel 253, Cymel 212, Cymel 1128, Cymel 701, Cymel 202, Cymel 207 (manufactured by Nihon Cytec Industries, Inc.), Nikalac MW-30M, Nikalac MW-30, Nikalac MW-22, Nikalac MW-24×, Nikalac MS-21, Nikalac MS-11, Nikalac MS-001, Nikalac MX-002, Nikalac MX-730, Nikalac MX-750, Nikalac MX-708, Nikalac MX-706, Nikalac MX-042, Nikalac MX-035, Nikalac MX-45, Nikalac MX-410, Nikalac MX-302, Nikalac MX-202, Nikalac SM-651, Nikalac SM-652, Nikalac SM-653, Nikalac SM-551, Nikalac SM-451, Nikalac SB-401, Nikalac SB-355, Nikalac SB-303, Nikalac SB-301, Nikalac SB-255, Nikalac SB-203, Nikalac SB-201, Nikalac BX-4000, Nikalac BX-37, Nikalac BX-55H, Nikalac BL-60 (manufactured by Sanwa Chemical Co., Ltd.), and the like. Among these, Cymel 325, Cymel 327, Cymel 703, Cymel 712, Cymel 254, Cymel 253, Cymel 212, Cymel 1128, Cymel 701, Cymel 202, and Cymel 207 are preferable.

Specific examples of the crosslinking agent (2) include epoxycyclohexyl group-containing compounds such as 3,4-epoxycyclohexylmethyl-3',4'-epoxycyclohexane carboxylate, 2-(3,4-epoxycyclohexyl-5,5-spiro-3,4-epoxy)cyclohexane-m-dioxane, bis(3,4-epoxycyclohexylmethyl)adipate, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), ethylene glycol di(3,4-epoxycyclohexylmethyl)ether, ethylenebis(3,4-epoxycyclohexane carboxylate), ε-caprolactone-modified 3,4-epoxycyclohexylmethyl-3',4'-epoxycyclohexane carboxylate, trimethylcaprolactone-modified 3,4-epoxycyclohexylmethyl-3',4'-epoxycyclohexane carboxylate, and β-methyl-δ-valerolactone-modified 3,4-epoxycyclohexylmethyl-3',4'-epoxycyclohexane carboxylate; diglycidyl ethers such as bisphenol A diglycidyl ether, bisphenol F diglycidyl ether, bisphenol S diglycidyl ether, chlorinated bisphenol A diglycidyl ether, chlorinated bisphenol F diglycidyl ether, chlorinated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerol triglycidyl ether, trimethylolpropane triglycidyl ether, polyethylene glycol diglycidyl ether, and polypropylene glycol diglycidyl ether; polyglycidyl ethers of polyether polyols obtained by adding at least one alkylene oxide to an aliphatic polyhydric alcohol (e.g., ethylene glycol, propylene glycol, or glycerol); diglycidyl esters of aliphatic long-chain dibasic acids; phenol, cresol, butylphenol, and a polyether alcohol obtained by adding an alkylene oxide to phenol, cresol, or butylphenol; and oxetane compounds having two or more oxetane rings in the molecule, such as 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy) methyl]benzene, 1,2-bis[(3-ethyl-3-oxetanylmethoxy) methyl]ethane, 1,3-bis[(3-ethyl-3-oxetanylmethoxy) methy]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl) ether, PO-modified hydrogenated bisphenol A bis(3-ethyl-3-oxetanylmethyl)ether, EO-modified bisphenol F bis(3-ethyl-3-oxetanylmethyl)ether, Aron Oxetane OXT-101, Aron Oxetane OXT-121, Aron Oxetane OXT-221 (manufactured by Toagosei Co., Ltd.), OXTP, OXBP, and OXIPA (manufactured by Ube Industries, Ltd.).

Among these, 1,6-hexanediol diglycidyl ether and dipentaerythritol hexakis(3-ethyl-3-oxetanylmethyl)ether are preferable as the crosslinking agent (2).

Alcohol Organic Solvent

The alcohol organic solvent includes an alcohol. A solvent that can sufficiently dissolve the hydroxyl group-containing resin and the crosslinking agent, and does not dissolve the first resist pattern formed using the first positive-tone radiation-sensitive resin composition may be used as the alcohol organic solvent. A monohydric alcohol having 1 to 8 carbon atoms is preferably used as the alcohol included in the alcohol organic solvent. Specific examples of the monohydric alcohol having 1 to 8 carbon atoms include 1-propanol, isopropyl alcohol, 1-butanol, 2-butanol, t-butanol, 1-pentanol, 2-pentanol, 3-pentanol, 2-methyl-1-butanol, 3-methyl-1-butanol, 3-methyl-2-butanol, 1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 1-heptanol, 2-heptanol, 2-methyl-2-heptanol, 2-methyl-3-heptanol, and the like. Among these, 1-butanol, 2-butanol, and 4-methyl-2-pentanol are preferable. These alcohols may be used either individually or in combination.

The alcohol organic solvent preferably has a water content (i.e., the water content relative to the total amount of the solvent) of 10 mass % or less, and more preferably 3 mass % or less. If the water content of the alcohol organic solvent exceeds 10 mass %, the solubility of the hydroxyl group-containing resin may deteriorate. The alcohol organic solvent is particularly preferably an alcohol-containing non-aqueous solvent (i.e., an absolute alcohol solvent does not substantially include water).

The resist pattern-insolubilizing resin composition may include a solvent (hereinafter may be referred to as "additional solvent") other than the alcohol organic solvent in order to adjust the applicability when applying the resist pattern-insolubilizing resin composition to the first resist pattern. A solvent that does not dissolve the first resist pattern, and allows uniform application of the resist pattern-insolubilizing resin composition may be used as the additional solvent.

Specific examples of the additional solvent include cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethoxyethyl acetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, and butyl acetate; water; and the like. Among these, cyclic ethers, alkyl ethers of polyhydric alcohols, alkyl ether acetates of polyhydric alcohols, ketones, esters, and water are preferable.

The additional solvent is normally used in an amount of 30 mass % or less, and preferably 20 mass % or less, based on the total amount of the solvent. If the amount of the additional solvent is more than 30 mass %, the first resist pattern may be dissolved so that intermixing with the resist pattern-insolubilizing resin composition may occur (i.e., the first resist pattern may be buried). When using water as the additional solvent, water is preferably used in an amount of 10 mass % or less.

4. Step (4)

In the step (4), the second resist layer is formed on the third resist pattern using the second positive-tone radiation-sensitive resin composition, exposed, and developed to form the fourth resist pattern. More specifically, the second resist layer is subjected to post-exposure bake (PEB) (e.g., 80 to 140° C. for 30 to 90 seconds), and developed using a 2.38 mass % tetramethylammonium hydroxide aqueous solution to form the fourth resist pattern. An ArF excimer laser is preferably used as the exposure light source.

Second Positive-Tone Radiation-Sensitive Resin Composition

Examples of the second positive-tone radiation-sensitive resin composition include the compositions illustrated above as the first positive-tone radiation-sensitive resin composition. The second positive-tone radiation-sensitive resin composition and the first positive-tone radiation-sensitive resin composition may be either the same or different.

II. Resist Pattern-Miniaturizing Resin Composition

The resist pattern-miniaturizing resin composition is used when forming the second resist pattern in the step (2) (see "I. Resist pattern-forming method". The resist pattern-miniaturizing resin composition includes a fluorine-containing resin that is soluble in an alkaline solution, and a non-aqueous solvent. The resist pattern-miniaturizing resin composition may optionally include additives such as a surfactant and a pH adjusting agent, and water. These additional components are used so that the object and the effects of the invention are not impaired.

1. Components (1) Fluorine-Containing Resin

The fluorine-containing resin is soluble in an alkaline solution. The fluorine-containing resin preferably includes at least one of a repeating unit that includes a group shown by the following general formula (1) (hereinafter may be referred to as "repeating unit (1)") and a repeating unit that includes a group shown by the following general formula (2) (hereinafter may be referred to as "repeating unit (2)"). It is more preferable that the repeating unit (1) be derived from a monomer shown by the following general formula (1-1) (hereinafter may be referred to as "monomer (1)"), and the repeating unit (2) be derived from a monomer shown by the following general formula (2-1) (hereinafter may be referred to as "monomer (2)"). It is particularly preferable that the fluorine-containing resin include at least one of a repeating unit that includes a carboxyl group (hereinafter may be referred to as "repeating unit (3)") and a repeating unit that includes a sulfonic acid group (hereinafter may be referred to as "repeating unit (4)").

(1)

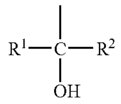

(2)

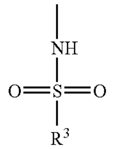

wherein each of $R^1$ and $R^2$ represents at least one of a hydrogen atom, an alkyl group having 1 to 4 carbon atoms, and a fluoroalkyl group having 1 to 4 carbon atoms wherein at least one of $R^1$ and $R^2$ represents a fluoroalkyl group having 1 to 4 carbon atoms, and $R^3$ represents a linear or branched alkyl group having 1 to 10 carbon atoms wherein at least one hydrogen atom is substituted with a fluorine atom.

(1-1)

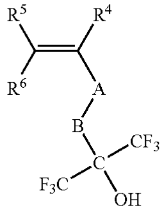

(2-1)

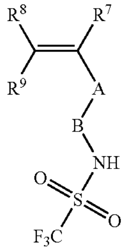

wherein each of $R^4$, $R^5$, and $R^6$ represents at least one of a hydrogen atom, an alkyl group having 1 to 10 carbon atoms, a hydroxymethyl group, a trifluoromethyl group, and a phenyl group, A represents a single bond, an oxygen atom, a carbonyl group, a carbonyloxy group, or an oxycarbonyl group, and B represents a single bond, a saturated chain-like hydrocarbon group having 1 to 20 carbon atoms, a monocyclic hydrocarbon group having 1 to 8 carbon atoms, or a polycyclic hydrocarbon group having 1 to 10 carbon atoms. Each of $R^7$, $R^8$, and $R^9$ represents at least one of a hydrogen atom, an alkyl group having 1 to 10 carbon atoms, a hydroxymethyl group, a trifluoromethyl group, and a phenyl group, A represents a single bond, an oxygen atom, a carbonyl group, a carbonyloxy group, or an oxycarbonyl group, and B represents a single bond, a saturated chain-like hydrocarbon group having 1 to 20 carbon atoms, a monocyclic hydrocarbon group having 1 to 8 carbon atoms, or a polycyclic hydrocarbon group having 1 to 10 carbon atoms. $R^4$, $R^5$, and $R^6$ may be different or the same. $R^7$, $R^8$, and $R^9$ may be different or the same.

The content of the repeating units (1) and (2) is preferably 90 mol % or more, and more preferably 95 mol % or more, based on the total amount of the repeating units that form the fluorine-containing resin.

Repeating Unit (1)

The repeating unit (1) includes a group shown by the general formula (1), and is preferably derived from the monomer (1).

Examples of the alkyl group having 1 to 4 carbon atoms represented by $R^1$ and $R^2$ in the general formula (1) include a methyl group, an ethyl group, a propyl group, and the like. Examples of the fluoroalkyl group having 1 to 4 carbon atoms include a trifluoromethyl group, a pentafluoroethyl group, and the like.

Examples of the alkyl group having 1 to 10 carbon atoms represented by $R^4$ to $R^6$ in the general formula (1-1) include a methyl group, an ethyl group, a propyl group, and the like. Specific examples of the chain-like hydrocarbon group having 1 to 20 carbon atoms represented by B include a methylene group, an ethylene group, a propylene group (e.g., 1,3-propylene group and 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a propylidene group, a 2-propylidene group, and the like. Specific examples of the monocyclic hydrocarbon group having 1 to 8 carbon atoms include monocyclic hydrocarbon groups such as cycloalkylene groups having 3 to 10 carbon atoms (e.g., a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group)).

When the group represented by B is a monocyclic hydrocarbon group having 1 to 8 carbon atoms or a polycyclic hydrocarbon group having 1 to 10 carbon atoms, an alkylene group having 1 to 4 carbon atoms (spacer) is preferably inserted between the bisperfluoroalkyl-hydroxymethyl group and the monocyclic hydrocarbon group having 1 to 8 carbon atoms.

Repeating Unit (2)

The repeating unit (2) includes a group shown by the general formula (2), and is preferably derived from the monomer (2).

Examples of the linear or branched alkyl group having 1 to 10 carbon atoms represented by $R^3$ in the general formula (2) wherein at least one hydrogen atom is substituted with a fluorine atom, include a group obtained by substituting at least one hydrogen atom of a methyl group, an ethyl group, a propyl group, a butyl group, a pentyl group, a hexyl group, a heptyl group, an octyl group, a nonyl group, a decyl group, or the like with a fluorine atom. It is preferable that the group represented by $R^3$ be a trifluoromethyl group.

Examples of the alkyl group having 1 to 10 carbon atoms represented by $R^7$ to $R^9$ in the general formula (2-1) include the alkyl groups having 1 to 10 carbon atoms illustrated above in connection with the repeating unit (1). Examples of the saturated chain-like hydrocarbon group having 1 to 20 carbon atoms, the monocyclic hydrocarbon group having 1 to 8 carbon atoms, and the polycyclic hydrocarbon group having 1 to 10 carbon atoms represented by B include the saturated chain-like hydrocarbon groups having 1 to 20 carbon atoms, the monocyclic hydrocarbon groups having 1 to 8 carbon atoms, and the polycyclic hydrocarbon groups having 1 to 10 carbon atoms illustrated above in connection with the repeating unit (1).

The monomer (2) is preferably 2-(((trifluoromethyl)sulfonyl)amino)ethyl-1-methacrylate, 2-(((trifluoromethyl)sulfonyl)amino)ethyl-1-acrylate, or any of the following compounds.

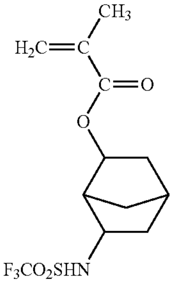

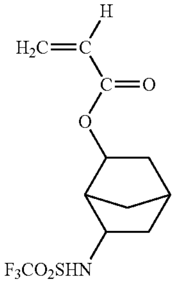

-continued

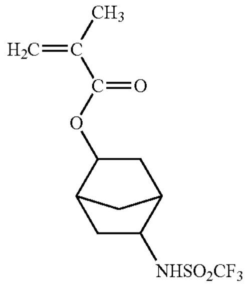

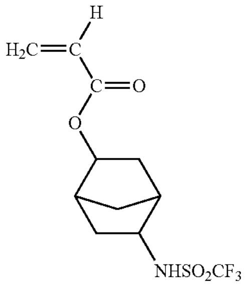

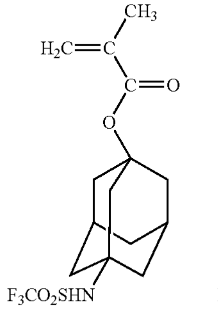

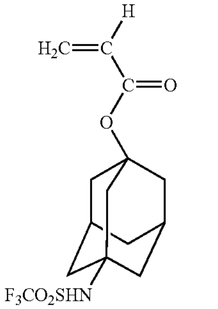

Repeating Units (3) and (4)

It is particularly preferable that the fluorine-containing resin further include at least one of the repeating units (3) and (4). The repeating unit (3) is preferably derived from a monomer shown by the following general formula (15-1) (hereinafter may be referred to as "monomer (3)"), and the repeating unit (2) is preferably derived from a monomer shown by the following general formula (15-2) (hereinafter may be referred to as "monomer (4)"). The content of the repeating units (3) and (4) is preferably 0.3 mol % or more, and more preferably 1 mol % or more, based on the total amount of the repeating units that form the fluorine-containing resin.

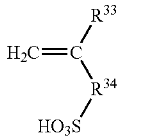

(15-1)

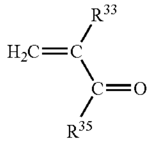

(15-2)

wherein $R^{33}$ represents a hydrogen atom, a methyl group, or a trifluoromethyl group, $R^{34}$ represents a single bond, a methylene group, a linear or branched alkylene group having 2 to 6 carbon atoms, or a group shown by the following general formula (16), and $R^{35}$ represents a linear or branched alkyl group having 1 to 12 carbon atoms wherein at least one hydrogen atom is substituted with a fluorine atom, or an alicyclic alkyl group having 1 to 12 carbon atoms wherein at least one hydrogen atom is substituted with a fluorine atom.

$$C(O)XR^{36} \quad (16)$$

wherein X represents an oxygen atom, a sulfur atom, or —NH, and $R^{36}$ represents a methylene group or a linear or branched alkylene group having 2 to 6 carbon atoms.

(2) Non-Aqueous Solvent

The non-aqueous solvent included in the resist pattern-miniaturizing resin composition is preferably an alcohol that is not intermixed with the first resist pattern when applying the resist pattern-miniaturizing resin composition to the first resist pattern. The resist pattern-miniaturizing resin composition may include an additional solvent other than the non-aqueous solvent in order to adjust the applicability when applying the resist pattern-miniaturizing resin composition to the first resist pattern. A solvent that does not dissolve the first resist pattern, and allows uniform application of the resist pattern-miniaturizing resin composition may be used as the additional solvent.

Alcohol

The alcohol is preferably a linear or branched alcohol having 1 to 12 carbon atoms, and more preferably a linear or branched alcohol having 1 to 8 carbon atoms. Specific examples of the linear or branched alcohol having 1 to 12 carbon atoms include 1-propanol, isopropyl alcohol, 1-butanol, 2-butanol, t-butanol, 1-pentanol, 2-pentanol, 3-pentanol, 2-methyl-1-butanol, 3-methyl-1-butanol, 3-methyl-2-butanol, 1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 1-heptanol, 2-heptanol, 2-methyl-2-heptanol, 2-methyl-3-heptanol, and the like. Among these, 1-butanol and 2-butanol are preferable. These alcohols may be used either individually or in combination.

The content of the alcohol is preferably 60 mass % or more, more preferably 70 mass % or more, and particularly preferably 80 mass % or more, based on the amount of the resist pattern-miniaturizing resin composition. If the content of the alcohol is less than 60 mass %, the solubility, etc. of the resist pattern-miniaturizing resin composition may deteriorate so that a precipitate may be produced when the composition is stored at room temperature for three months or more. The upper limit of the content of the alcohol is not particularly limited, but is normally 97 mass % or less.

Additional Solvent

Specific examples of the additional solvent include cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethoxyethyl acetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, and butyl acetate; and the like. Among these, cyclic ethers, alkyl ethers of polyhydric alcohols, alkyl ether acetates of polyhydric alcohols, ketones, and esters are preferable.

The content of the additional solvent is preferably less than 30 mass %, more preferably 20 mass % or less, and particularly preferably 10 mass % or less, based on the amount of the resist pattern-miniaturizing resin composition. If the content of the additional solvent is 30 mass % or more, the first resist pattern may be dissolved so that the shape of the resist pattern may significantly deteriorate. The lower limit of the content of the additional solvent is not particularly limited, but is normally 3 mass % or more.

(3) Surfactant

The resist pattern-miniaturizing resin composition may further include a surfactant. The surfactant improves the applicability, defoamability, leveling properties, etc., of the resist pattern-miniaturizing resin composition.

Examples of the surfactant include commercially available fluorine-containing surfactants such as BM-1000, BM-1100 (manufactured by BM Chemie), Megafac F142D, Megafac F172, Megafac F173, Megafac F183 (manufactured by DIC Corporation), Fluorad FC-135, Fluorad FC-170C, Fluorad FC-430, Fluorad FC-431 (manufactured by Sumitomo 3M, Ltd.), Surflon S-112, Surflon S-113, Surflon S-131, Surflon S-141, Surflon S-145 (manufactured by Asahi Glass Co., Ltd.), SH-28PA, SH-190, SH-193, SZ-6032, and SF-8428 (manufactured by Dow Corning Toray Silicone Co., Ltd.).

The surfactant is normally used in an amount of 5 mass % or less based on the amount of the resist pattern-miniaturizing resin composition.

(4) Water

Water that may be added to the resist pattern-miniaturizing resin composition is preferably water (i.e., ultrapure water) used for semiconductor device production. Water is normally used in an amount of 10 mass % or less based on the amount of the resist pattern-miniaturizing resin composition.

2 Property Value

The weight average molecular weight (Mw) of the resist pattern-miniaturizing resin composition is preferably 2000 to 50,000, and more preferably 2500 to 20,000. If the Mw of the resist pattern-miniaturizing resin composition is more than 50,000, the solubility of the resist pattern-miniaturizing resin composition in the solvent may significantly decrease. If the Mw of the resist pattern-miniaturizing resin composition is less than 2000, the resist pattern may collapse. The ratio (Mw/Mn) of the Mw to the number average molecular weight (Mn) of the resist pattern-miniaturizing resin composition is preferably 1 to 5, more preferably 1 to 3, and particularly preferably 1 to 2. The term "weight average molecular weight (Mw)" used herein refer to a polystyrene-reduced weight average molecular weight determined by gel permeation chromatography (GPC), and the term "number average molecular weight (Mn)" used herein refer to a polystyrene-reduced number average molecular weight determined by gel permeation chromatography (GPC).

It is preferable that the resist pattern-miniaturizing resin composition have an impurity (e.g., halogen and metal) content as low as possible. The resist pattern-miniaturizing resin composition exhibits improved applicability and improved (uniform) solubility in the alkaline developer by reducing the impurity content. The resist pattern-miniaturizing resin composition may be purified by a chemical purification method (e.g., washing with water or liquid-liquid extraction) or a combination of the chemical purification method and a physical purification method (e.g., ultrafiltration or centrifugation), for example. Specifically, the resist pattern-miniaturizing resin composition may be purified by filtering the resist pattern-miniaturizing resin composition through a filter having a pore size of 10 to 40 nm or less. In this case, it is preferable to use a circulation filtration method. An HDPE filter (manufactured by Pall Corporation, pore size: 30 or 40 nm) may be used.

EXAMPLES

The invention is further described below by way of examples. Note that the invention is not limited to the following examples. In the examples and comparative examples, the units "parts" and "%" respectively refer to "parts by mass" and "mass %", unless otherwise indicated. The property value measurement methods and the property evaluation methods employed in the examples and comparative examples are given below. An evaluation substrate on which a first resist pattern is formed is referred to as an evaluation substrate A, an evaluation substrate on which a second resist pattern is formed is referred to as an evaluation substrate B, an evaluation substrate on which a third resist pattern is formed is referred to as an evaluation substrate C, and an evaluation substrate on which a fourth resist pattern is formed is referred to as an evaluation substrate D.

Solid content (%) of resin solution: 0.3 g of the resin solution was weighed on an aluminum dish, and heated on a hot plate at 14° C. for one hour. The solid content of the resin solution was calculated from the mass of the resin solution before heating and the mass of the residue (after heating).

Weight average molecular weight (Mw) and number average molecular weight (Mn): The weight average molecular weight (Mw) and the number average molecular weight (Mn) were measured by gel permeation chromatography (GPC) using GPC columns (manufactured by Tosoh Corp., G2000HXL×2, G3000HXL×1, G4000HXL×1) (flow rate: 1.0 ml/min, eluant: tetrahydrofuran, column temperature: 40° C., standard: monodisperse polystyrene). The dispersibility "Mw/Mn" was calculated from the Mw and Mn measurement results.

Low-molecular-weight component residual rate (%): The peak surface area attributed to the monomer was measured by gel permeation chromatography (GPC) using GPC columns (manufactured by Tosoh Corp., G2000HXL×2, G3000HXL× 1, G4000HXL×1) (flow rate: 1.0 ml/min, eluant:tetrahydrofuran, column temperature: 40° C., standard: monodisperse polystyrene). The low-molecular-weight component residual rate was calculated from the measurement results.

Content (mol %) of repeating unit: The content of each repeating unit was measured by $^{13}$C-NMR analysis using an instrument "JNM-EX270" (manufactured by JEOL Ltd.).

Reduction in line width (nm): The line width of the evaluation substrate A and the line width of the evaluation substrate B produced using the evaluation substrate A (line width: 75 nm) were measured using a scanning electron microscope ("S-9380" manufactured by Hitachi High-Technologies Corporation). A reduction in line width was calculated from the measurement results by the following expression.

Reduction in line width (nm)=line width (nm) of evaluation substrate A−line width (nm) of evaluation substrate B Line width roughness (LWR): The LWR of the evaluation substrates B, E, and F produced using the evaluation substrate A (line width: 75 nm) was measured using a scanning electron microscope ("S-9380" manufactured by Hitachi High-Technologies Corporation, LWR measurement mode). FIG. 1 is a plan view schematically showing a line pattern (elevations and depressions are exaggerated for the purpose of explanation). The width of the line pattern was measured along the longitudinal axis (measurement range: 1000 nm) at thirty-two measurement points W1 to W32 located at equal intervals. The 3σ value of the line width at each measurement point was measured. The above measurement was for performed for ten line patterns. The average 3σ value of the ten line patterns was taken as the LWR.

LWR=[first line pattern (3σ value)+second line pattern (3σ value) . . . +tenth line pattern (3σ value)]/10

Evaluation of pattern: A case where a 90 nm line could be formed on the evaluation substrates D and G within the space area of the third resist pattern (60 nm line/200 nm pitch line-and-space pattern) formed on the evaluation substrate C was evaluated as "Good", and a case where (i) the third resist pattern was removed, (ii) the fourth resist pattern was not formed, or (iii) the fourth resist pattern was formed, but remained undissolved on the third resist pattern was evaluated as "Bad".

Preparation of Fluorine-Containing Resin

Synthesis Example 1

46.95 g (85 mol %) of 1,1,1-trifluoro-2-trifluoromethyl-2-hydroxy-4-pentyl methacrylate (monomer (A)) and 6.91 g of 2,2'-azobis(methyl 2-methylpropionate) (initiator) were dissolved in 100 g of isopropyl alcohol (IPA) to prepare a monomer solution. A three-necked flask (500 ml) equipped with a thermometer and a dropping funnel was charged with 50 g of IPA, and purged with nitrogen for 30 minutes. After nitrogen purge, IPA contained in the flask was heated to 80° C. with stirring using a magnetic stirrer. The monomer solution prepared as described above was added dropwise to the flask using the dropping funnel over two hours. After the addition, the mixture was reacted for one hour. After the dropwise addition of 10 g of an IPA solution containing 3.05 g (15 mol %) of vinylsulfonic acid (monomer (B)) over 30 minutes, the mixture was reacted for one hour. The mixture was then cooled to 30° C. or less to obtain a copolymer solution.

The copolymer composition was concentrated to 150 g, and put into a separating funnel. 50 g of methanol and 600 g of n-hexane were added to the separating funnel to effect separation and purification. The lower layer thus separated was recovered. The solution thus recovered was diluted with IPA so that the amount of the diluted solution was 100 g, and put into a separating funnel. 50 g of methanol and 600 g of n-hexane were added to the separating funnel to effect separation and purification. The lower layer thus separated was recovered. The solvent of the solution thus recovered was replaced with 4-methyl-2-pentanol so that the total amount of the mixture was 250 g. 250 g of water was then added to the mixture to effect separation and purification. The upper layer thus separated was recovered. The solvent of the solution thus recovered was replaced with 4-methyl-2-pentanol to obtain a resin solution.

The copolymer (1) contained in the resin solution had an Mw of 7960 and an Mw/Mn ratio of 1.51. The yield was 65%. The ratio of the content (mol %) of the repeating unit derived from the monomer (A) contained in the copolymer (1) to the content (mol %) of the repeating unit derived from the monomer (B) contained in the copolymer (1) was 95:5. The copolymer (1) is referred to as a fluorine-containing resin (A-1). The structure of the fluorine-containing resin (A-1) is given below.

(A-1)

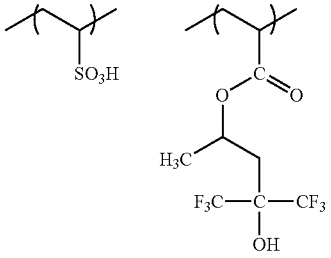

Synthesis Examples 2 to 5

A copolymer was obtained in the same manner as in Synthesis Example 1, except for changing the conditions as shown in Table 1. The resulting copolymers are referred to as fluorine-containing resins (A-1) to (B-3). The Mw, the Mw/Mn ratio, and the yield of each fluorine-containing resin, and the ratio of the content (mol %) of the repeating unit derived from the monomer (A) to the content (mol %) of the repeating unit derived from the monomer (B) are shown in Table 1. The structure of each fluorine-containing resin is given below.

TABLE 1

| | Monomer (A) | | Monomer (B) | | Fluorine-containing resin | | | | |
|---|---|---|---|---|---|---|---|---|---|
| | | | | | | | | Content | |
| | Type | Amount (mol %) | Type | Amount (mol %) | Type | Mw | Mw/Mn | ((A):(B)) (mol %) | Yield (%) |
| Synthesis Example 1 | Monomer (a) | 85 | Monomer (c) | 15 | A-1 | 9,760 | 1.51 | 95:5 | 65 |
| Synthesis Example 2 | Monomer (a) | 85 | Monomer (d) | 15 | A-2 | 8,500 | 1.53 | 96:4 | 67 |
| Synthesis Example 3 | Monomer (b) | 85 | Monomer (c) | 15 | B-1 | 7,400 | 1.57 | 97:3 | 62 |
| Synthesis Example 4 | Monomer (b) | 85 | Monomer (d) | 15 | B-2 | 8,800 | 1.51 | 96:4 | 68 |
| Synthesis Example 5 | Monomer (b) | 50 (g) | — | — | B-3 | 6,200 | 1.60 | — | 66 |

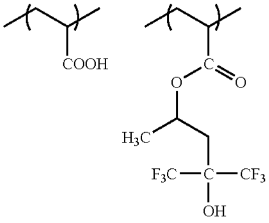

(A-2)

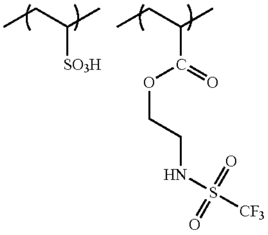

(B-1)

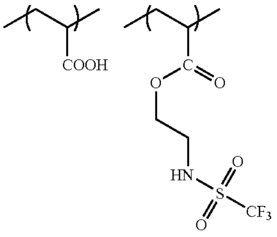

(B-2)

TABLE 1-continued

| | Monomer (A) | | Monomer (B) | | Fluorine-containing resin | | | | |
|---|---|---|---|---|---|---|---|---|---|
| | | | | | | | | Content | |
| | Type | Amount (mol %) | Type | Amount (mol %) | Type | Mw | Mw/Mn | ((A):(B)) (mol %) | Yield (%) |
| 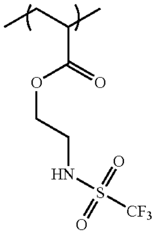 (B-3) | | | | | | | | | |

The following monomers were used in Synthesis Examples 2 to 5.

Monomer (a): 1,1,1-trifluoro-2-trifluoromethyl-2-hydroxy-4-pentyl methacrylate

Monomer (b): 2-(((trifluoromethyl)sulfonyl)amino)ethyl methacrylate

Monomer (c): vinylsulfonic acid

Monomer (d): vinylcarboxylic acid

Production of Resist Pattern-Miniaturizing Resin Composition

Examples 1 to 6

The fluorine-containing resin and a solvent were mixed in a ratio shown in Table 2, and stirred for three hours. The solution was prebaked (PB), and filtered through a filter having a pore size of 0.03 μm to obtain a resist pattern-miniaturizing resin composition.

TABLE 2

| | Fluorine-containing resin | | Solvent | | PB condition | | Resist pattern-miniaturizing |
|---|---|---|---|---|---|---|---|
| | Type | Amount (g) | Type | Amount (g) | Temperature (° C.) | Time (s) | resin composition |
| Example 1 | A-1 | 10 | S-1 | 280 | 150 | 90 | 1 |
| Example 2 | A-2 | 10 | S-1 | 280 | 150 | 90 | 2 |
| Example 3 | B-1 | 10 | S-1 | 280 | 150 | 90 | 3 |
| Example 4 | B-2 | 10 | S-1 | 280 | 150 | 90 | 4 |
| Example 5 | B-3 | 10 | S-2 | 280 | 150 | 90 | 5 |
| Example 6 | A-1 | 10 | S-2 | 280 | 150 | 90 | 6 |

The following solvents were used in Examples 1 to 6.

Solvent

S-1:1-butanol

S-2: 4-methyl-2-pentanol

Preparation of Acid-Dissociable Group-Containing Resin

Synthesis Example 6

53.93 g (50 mol %) of a compound shown by the following formula (m-1), 10.69 g (10 mol %) of a compound shown by the following formula (m-2), and 35.38 g (40 mol %) of a compound shown by the following formula (m-3) were dissolved in 200 g of 2-butanone. 5.58 g of dimethyl 2,2'-azobis (2-methylpropionate) was added to the solution to prepare a monomer solution. A three-necked flask (1000 ml) was charged with 100 g of 2-butanone, purged with nitrogen for 30 minutes, and heated to 80° C. with stirring. The monomer solution prepared as described above was added dropwise to the flask using a dropping funnel over three hours. The monomers were polymerized for six hours from the start of the addition of the monomer solution. After polymerization, the solution was cooled to 30° C. or less, and poured into 2000 g of methanol. A white precipitate produced was collected by filtration. The white powder thus collected was washed twice with 400 g of methanol in a slurry state, collected by filtration, and dried at 50° C. for 17 hours to obtain 74 g of a white powdery polymer (yield: 74%). The polymer had an Mw of 6900 and an Mw/Mn ratio of 1.70. The polymer contained a repeating unit shown by the following formula (C-1). The content (mol %) ratio of each repeating unit was a/b/c=53.0/9.8/37.2. This polymer is referred to as an acid-dissociable group-containing resin (A-1).

(m-1)

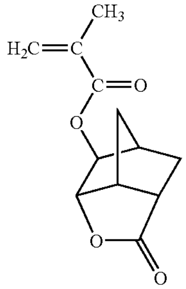

-continued (m-2)

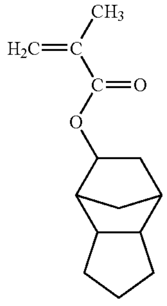

(m-3)

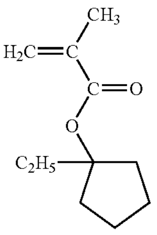

(C-1)

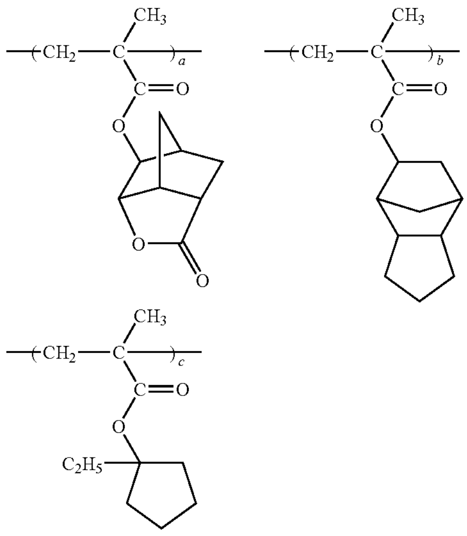

Synthesis Example 7

A polymer was obtained in the same manner as in Synthesis Example 6, except for using 39.14 g (37 mol %) of a compound shown by the following formula (m-4) instead of the compound shown by the formula (m-2), and using 50.16 g (50 mol %) of the compound shown by the formula (m-1) and 10.70 g (13 mol %) of the compound shown by the formula (m-3) (78 g, yield: 78%). The polymer thus obtained had an Mw of 5200, an Mw/Mn ratio of 1.62, and a low-molecular-weight component residual rate of 0.03%. As a result of $^{13}C$-NMR analysis, the polymer was found to contain a repeating unit shown by the following formula (C-2). The content (mol %) ratio of each repeating unit was a/b/c=50.0/37.0/13.2. This polymer is referred to as an acid-dissociable group-containing resin (C-2).

(m-4)

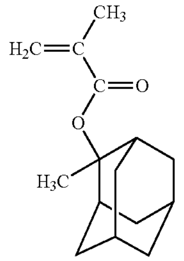

(C-2)

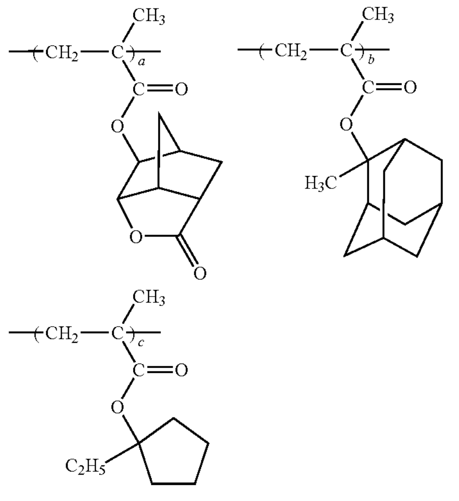

Synthesis Example 8

A polymer was obtained in the same manner as in Synthesis Example 6, except for using 35.6 g (35 mol %) of a compound shown by the following formula (m-5) instead of the compound shown by the formula (m-2), using 16.17 g (15 mol %) of a compound shown by the following formula (m-6) instead of the compound shown by the formula (m-3), and using 48.23 g (50 mol %) of the compound shown by the formula (m-1) (72 g, yield: 72%). The polymer thus obtained had an Mw of 8200, an Mw/Mn ratio of 1.78, and a low-molecular-weight component residual rate of 0.03%. As a result of $^{13}C$-NMR analysis, the polymer was found to contain a repeating unit shown by the following formula (C-3). The content (mol %) ratio of each repeating unit was a/b/c=50.0/36.9/13.1. This polymer is referred to as an acid-dissociable group-containing resin (C-3).

(m-5)

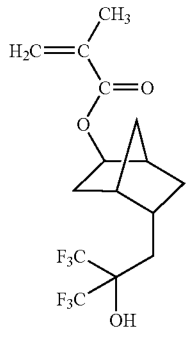

-continued (m-6)

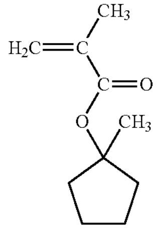

(C-3)

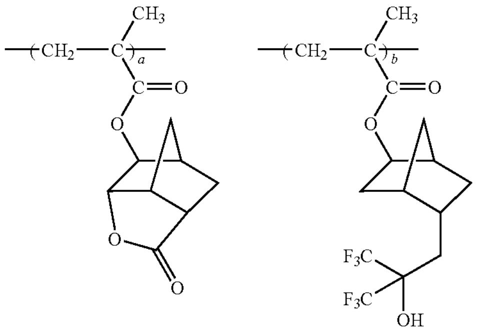

-continued

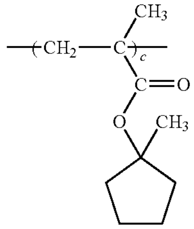

Preparation of Positive-Tone Radiation-Sensitive Resin Composition

Synthesis Examples 9 to 20

The acid-dissociable group-containing resin ((C-1) to (C-3)), an acid generator (D), an acid diffusion controller (E), and a solvent (F) were mixed in a ratio shown in Table 3, and stirred for three hours. The solution was filtered through a filter having a pore size of 0.03 μm to obtain a positive-tone radiation-sensitive resin composition.

TABLE 3

| | Acid-dissociable group-containing resin | | Acid generator | | Acid diffusion controller | | Solvent | | Positive-tone |
|---|---|---|---|---|---|---|---|---|---|
| | Type | Parts by mass | Type | Parts by mass | Type | Parts by mass | Type | Parts by mass | radiation-sensitive resin composition |
| Synthesis Example 9 | C-1 | 100 | D-1/D-2 | 6/1 | E-1 | 0.5 | F-1/F-2 | 1420/30 | 1[2] |
| Synthesis Example 10 | C-1 | 100 | D-1/D-3 | 6/1 | E-1 | 0.5 | F-1/F-2 | 1420/30 | 2[1] |
| Synthesis Example 11 | C-1 | 100 | D-2 | 7 | E-2 | 2.5 | F-1/F-2 | 1420/30 | 3[2] |
| Synthesis Example 12 | C-1 | 100 | D-2 | 7 | E-2 | 3.0 | F-1/F-2 | 1420/30 | 4[2] |
| Synthesis Example 13 | C-2 | 100 | D-1/D-2 | 6/1 | E-1 | 0.5 | F-1/F-2 | 1420/30 | 5[1] |
| Synthesis Example 14 | C-2 | 100 | D-1/D-3 | 6/1 | E-1 | 0.5 | F-1/F-2 | 1420/30 | 6[1] |
| Synthesis Example 15 | C-2 | 100 | D-2 | 7 | E-2 | 2.5 | F-1/F-2 | 1420/30 | 7[2] |
| Synthesis Example 16 | C-2 | 100 | D-2 | 7 | E-2 | 3.0 | F-1/F-2 | 1420/30 | 8[2] |
| Synthesis Example 17 | C-3 | 100 | D-1/D-2 | 6/1 | E-1 | 0.5 | F-1/F-2 | 1420/30 | 9[1] |
| Synthesis Example 18 | C-3 | 100 | D-1/D-3 | 6/1 | E-1 | 0.5 | F-1/F-2 | 1420/30 | 10[1] |
| Synthesis Example 19 | C-3 | 100 | D-2 | 7 | E-2 | 2.5 | F-2/F-2 | 1420/30 | 11[2] |
| Synthesis Example 20 | C-3 | 100 | D-2 | 7 | E-2 | 3.0 | F-2/F-2 | 1420/30 | 12[2] |

[1]First positive-tone radiation-sensitive resin composition

[2]Second positive-tone radiation-sensitive resin composition

The acid generator (D), the acid diffusion controller (E), and the solvent (F) used in Synthesis Examples 9 to 20 are as follows.

Acid Generator (D)

(D-1): 4-nonafluoro-n-butylsulfonyloxyphenyl.diphenylsulfonium nonafluoro-n-butanesulfonate (D-2): triphenylsulfonium.nonafluoro-n-butanesulfonate (D-3): triphenylsulfonium 2-bicyclo[2.2.1]hept-2-yl-1,1-difluoroethanesulfonate Acid Diffusion Controller (E)

(E-1): (R)-(+)-1-(t-butoxycarbonyl)-2-pyrrolidinemethanol N-p-butoxycarbonylpyrrolidine (E-2): triphenylsulfonium salicylate Solvent (F)

(F-1): propylene glycol monoethyl ether acetate (F-2): γ-butyrolactone

Preparation of Hydroxyl Group-Containing Resin

Synthesis Example 21

A three-necked flask (500 ml) purged with nitrogen for 30 minutes was charged with a solution prepared by dissolving 31.06 g of p-hydroxymethacrylanilidea and 18.94 g of t-butoxystyrene in 150 g of IPA, and 4.18 g of 2,2'-azobisisobutyronitrile. The mixture was reacted at 80° C.) for six hours with stirring. After completion of the reaction, the polymer solution was cooled to 30° C. or less. After the addition of 100 g of ethyl acetate, 70 g of IPA, and 300 g of ultrapure water, the mixture was stirred for 30 minutes, and allowed to stand. The lower layer was then recovered. After the addition of 100 g of ethyl acetate, 70 g of IPA, 70 g of methanol, and 300 g of ultrapure water, the mixture was stirred for 30 minutes, and allowed to stand. The lower layer was then recovered. The solvent was replaced with 1-butanol so that the solid content was 22 to 28% to obtain a hydroxyl group-containing resin containing a repeating unit shown by the following formula (17) (yield: 60%). The content (mol %) ratio of each repeating unit was x/y=55/45. The hydroxyl group-containing resin had an Mw of 5800 and an Mw/Mn ratio of 1.6.

(17)

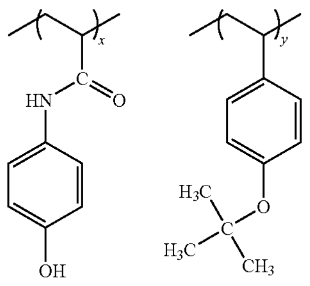

Production of Resist Pattern-Insolubilizing Resin Composition

Synthesis Example 22

10.5 g of a hydroxyl group-containing resin including a repeating unit shown by the formula (17), 4.0 g of a crosslinking agent ("Nikalac MX-750" manufactured by Nippon Carbide Industries Co., Inc.), and 275 g of an alcohol solvent (1-butanol) were mixed to prepare a resist pattern-insolubilizing resin composition.

Example 7

A lower-layer antireflective film composition ("ARC29A" manufactured by Brewer Science) was spin-coated onto an 8-inch silicon wafer using a system "CLEAN TRACK ACTS8" (manufactured by Tokyo Electron Ltd.), and prebaked (PB) (205° C., 60 sec) to form a film (thickness: 77 nm). An alicyclic radiation-sensitive resin composition "JSR ArF AR2014J" (manufactured by JSR Corporation) was then patterned. The first positive-tone radiation-sensitive resin composition (1) synthesized by Synthesis Example 9 was spin-coated, and prebaked (PB) (115° C., 90 sec) to form a first resist film (thickness: 150 nm). The first resist film was exposed (dose: 30 mJ/cm$^2$) using an ArF projection aligner ("S306C" manufactured by Nikon Corporation) (NA: 0.78, σ: 0.85, 2/3Ann), and subjected to post-exposure bake (PEB) (115° C., 90 sec) on a hot plate. After performing puddle development (60 sec) using an LD nozzle, the first resist film was rinsed with ultrapure water, and spin-dried at 4000 rpm for 15 seconds to obtain an evaluation substrate A on which a first resist pattern was formed. A plurality of evaluation substrates A were prepared under the same conditions.

The evaluation substrate A thus obtained was observed using a scanning electron microscope ("S-9380" manufactured by Hitachi High-Tech Fielding Corporation). It was confirmed that a 75 nm line/200 nm pitch pattern was formed.

The resist pattern-miniaturizing resin composition (1) obtained by Example 1 was spin-coated onto the evaluation substrate A to a thickness of 150 nm using a system "CLEAN TRACK ACTS8" (manufactured by Tokyo Electron Ltd.), and prebaked (PB) (150° C., 60 sec). The composition was cooled for 30 seconds using a cooling plate (23° C.). After performing puddle development (60 sec) using an LD nozzle, the composition was rinsed with ultrapure water, and spin-dried at 4000 rpm for 15 seconds to obtain an evaluation substrate B on which a second resist pattern was formed. The evaluation substrate B had a reduction in line width of 17 nm and an LWR of 6.5 nm.

Examples 8 to 20

An evaluation substrate B was obtained in the same manner as in Example 7, except for changing the first positive-tone radiation-sensitive resin composition and the resist pattern-miniaturizing resin composition as shown in Table 4. The reduction in line width and the LWR of each evaluation substrate B are shown in Table 4.

Comparative Example 1

An evaluation substrate A was obtained using the first positive-tone radiation-sensitive resin composition shown in Table 4. An evaluation substrate E was obtained in the same manner as in Example 7, except for applying 290 g of 1-butanol instead of the resist pattern-miniaturizing resin composition. The reduction in line width and the LWR of the resulting evaluation substrate E are shown in Table 4.

Comparative Example 2

An evaluation substrate A was obtained using the first positive-tone radiation-sensitive resin composition shown in Table 4. An evaluation substrate F was obtained in the same manner as in Example 7, except that the resist pattern-miniaturizing resin composition and the solvent were not applied. The reduction in line width and the LWR of the resulting evaluation substrate F are shown in Table 4.

TABLE 4

| | First positive-tone radiation-sensitive resin composition | Resist pattern-miniaturizing resin composition | Reduction in line width (nm) | LWR (nm) |
|---|---|---|---|---|
| Example 7 | 1 | 1 | 17 | 6.5 |
| Example 8 | 1 | 2 | 16 | 6.8 |
| Example 9 | 1 | 3 | 22 | 6.0 |
| Example 10 | 1 | 4 | 20 | 6.2 |
| Example 11 | 1 | 5 | 11 | 6.0 |
| Example 12 | 1 | 6 | 15 | 6.8 |
| Example 13 | 5 | 1 | 19 | 6.1 |
| Example 14 | 5 | 2 | 16 | 6.0 |
| Example 15 | 6 | 3 | 20 | 6.3 |
| Example 16 | 6 | 4 | 21 | 6.4 |
| Example 17 | 9 | 1 | 20 | 6.0 |
| Example 18 | 9 | 2 | 17 | 6.1 |
| Example 19 | 10 | 1 | 19 | 6.0 |
| Example 20 | 10 | 2 | 16 | 6.4 |
| Comparative Example 1 | 1 | 1-Butanol | 7 | 6.5 |
| Comparative Example 2 | 1 | — | 2 | 6.6 |

Example 21

Example 21 is an application example. The resist pattern-insolubilizing resin composition was spin-coated onto an evaluation substrate B obtained in the same manner as in Example 7 to a thickness of 150 nm using a system "CLEAN TRACK ACT8" (manufactured by Tokyo Electron Ltd.), and prebaked (PB) (150° C., 60 sec). The composition was cooled for 30 seconds using a cooling plate (23° C.). After performing puddle development (60 sec) using an LD nozzle (developer: 2.38% tetramethylammonium hydroxide aqueous solution), the composition was rinsed with ultrapure water. The composition was spin-dried at 2000 rpm for 15 seconds to obtain an evaluation substrate C on which a third resist pattern was formed.

The second positive-tone radiation-sensitive resin composition (3) was spin-coated onto the third resist pattern formed on the evaluation substrate C using a system "CLEAN TRACK ACT8" (manufactured by Tokyo Electron Ltd.), prebaked (PB) (100° C., 60 sec), and cooled (23° C., 30 sec) to form a coating film having a thickness of 150 nm. The space area of the insolubilized resist pattern was exposed through a mask using an ArF liquid immersion lithographic apparatus (NA: 0.78, Outer/Inner=0.89/0.59 Annular). The resist pattern was subjected to post-exposure bake (PEB) (95° C., 60 sec) on a hot plate, and cooled (23° C., 30 sec). After performing puddle development (30 sec) using an LD nozzle (developer: 2.38% tetramethylammonium hydroxide aqueous solution), the resist pattern was rinsed with ultrapure water. The resist pattern was then spin-dried at 2000 rpm for 15 seconds to obtain an evaluation substrate D on which a fourth resist pattern was formed. The pattern formed on the evaluation substrate D was evaluated as "Good".

Examples 22 to 34

An evaluation substrate D was obtained in the same manner as in Example 21, except for changing the first positive-tone radiation-sensitive resin composition, the resist pattern-miniaturizing resin composition, and the second positive-tone radiation-sensitive resin composition as shown in Table 5. The evaluation results are shown in Table 5.

Comparative Example 3

An evaluation substrate G was obtained in the same manner as in Example 21, except for using methyl ethyl ketone instead of the resist pattern-miniaturizing resin composition, and performing PB at 15° C. for 90 seconds. The evaluation results are shown in Table 5.

TABLE 5

| | First positive-tone radiation-sensitive resin composition | Resist pattern-miniaturizing resin composition | Second positive-tone radiation-sensitive resin composition | Evaluation of pattern |
|---|---|---|---|---|
| Example 21 | 1 | 1 | 3 | Good |
| Example 22 | 2 | 3 | 4 | Good |
| Example 23 | 5 | 5 | 7 | Good |
| Example 24 | 6 | 1 | 8 | Good |
| Example 25 | 9 | 3 | 11 | Good |
| Example 26 | 10 | 1 | 12 | Good |
| Example 27 | 1 | 1 | 4 | Good |
| Example 28 | 2 | 2 | 7 | Good |
| Example 29 | 5 | 6 | 8 | Good |
| Example 30 | 6 | 2 | 11 | Good |
| Example 31 | 9 | 4 | 12 | Good |
| Example 32 | 10 | 2 | 4 | Good |
| Example 33 | 1 | 2 | 7 | Good |
| Example 34 | 2 | 1 | 11 | Good |
| Comparative Example 3 | 1 | Methyl ethyl ketone | 3 | Bad |

The resist pattern-forming method and the resist pattern-miniaturizing resin composition according to the embodiment of the invention can effectively and accurately reduce the space of a resist pattern, and can advantageously and economically form a resist pattern. Therefore, the resist pattern-forming method and the resist pattern-miniaturizing resin composition according to the embodiment of the invention may be suitably used in the field of microfabrication such as production of integrated circuit devices that are expected to be further scaled down in the future.

The resist pattern-forming method according to the embodiment of the invention can form a fine resist pattern having a line width of 50 nm or less using an ArF excimer laser. The resist pattern-miniaturizing resin composition according to the embodiment of the invention can be easily applied to the first resist pattern, and suppresses pattern collapse after miniaturization while reducing line width roughness (LWR).

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A resist pattern-forming method comprising:

forming a first resist pattern using a first positive-tone radiation-sensitive resin composition;

applying a resist pattern-miniaturizing resin composition to the first resist pattern;

baking the resist pattern-miniaturizing resin composition applied to the first resist pattern to form a layer soluble by a developer in the first resist pattern;

developing the resist pattern-miniaturizing resin composition and the first resist pattern by the developer to dissolve the layer and to form a second resist pattern that is miniaturized from the first resist pattern;

applying a resist pattern-insolubilizing resin composition to the second resist pattern;

baking and washing the resist pattern-insolubilizing resin composition applied to the second resist pattern to form a third resist pattern that is insoluble in a developer and a second positive-tone radiation-sensitive resin composition;

forming a second resist layer on the third resist pattern using the second positive-tone radiation-sensitive resin composition; and exposing and developing the second resist layer to form a fourth resist pattern.

2. The resist pattern-forming method according to claim 1, wherein the pattern-miniaturizing resin composition comprises:

a fluorine-containing resin that is soluble in an alkaline solution; and a non-aqueous solvent.

3. The resist pattern-forming method according to claim 2, wherein the non-aqueous solvent comprises a monohydric alcohol having 1 to 12 carbon atoms in an amount of 60 mass % or more.

4. The resist pattern-forming method according to claim 2, wherein the fluorine-containing resin comprises at least one of a repeating unit that includes a group shown by a following general formula (1) and a repeating unit that includes a group shown by a following general formula (2), (1)

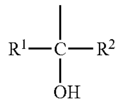

(2)

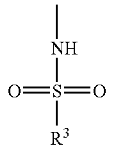

wherein each of $R^1$ and $R^2$ represents at least one of a hydrogen atom, an alkyl group having 1 to 4 carbon atoms, and a fluoroalkyl group having 1 to 4 carbon atoms wherein at least one of $R^1$ and $R^2$ represents a fluoroalkyl group having 1 to 4 carbon atoms, and $R^3$ represents a linear or branched alkyl group having 1 to 10 carbon atoms wherein at least one hydrogen atom is substituted with a fluorine atom.

5. The resist pattern-forming method according to claim 4, wherein the repeating unit that includes the group shown by the general formula (1) is derived from a monomer shown by a following general formula (1-1), (1-1)

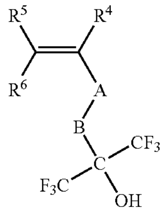

wherein each of $R^4$, $R^5$, and $R^6$ represents at least one of a hydrogen atom, an alkyl group having 1 to 4 carbon atoms, a hydroxymethyl group, a trifluoromethyl group, and a phenyl group, A represents a single bond, an oxygen atom, a carbonyl group, a carbonyloxy group, or an oxycarbonyl group, and B represents a single bond, a saturated chain-like hydrocarbon group having 1 to 20 carbon atoms, a monocyclic hydrocarbon group having 1 to 8 carbon atoms, or a polycyclic hydrocarbon group having 1 to 10 carbon atoms.

6. The resist pattern-forming method according to claim 4, wherein the repeating unit that includes the group shown by the general formula (2) is derived from a monomer shown by a following general formula (2-1), (2-1)

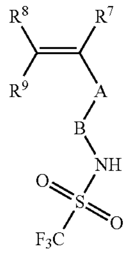

wherein each of $R^7$, $R^8$, and $R^9$ represents at least one of a hydrogen atom, an alkyl group having 1 to 10 carbon atoms, a hydroxymethyl group, a trifluoromethyl group, and a phenyl group, A represents a single bond, an oxygen atom, a carbonyl group, a carbonyloxy group, or an oxycarbonyl group, and B represents a single bond, a saturated chain-like hydrocarbon group having 1 to 20 carbon atoms, a monocyclic hydrocarbon group having 1 to 8 carbon atoms, or a polycyclic hydrocarbon group having 1 to 10 carbon atoms.

7. The resist pattern-forming method according to claim 4, wherein the fluorine-containing resin further includes at least one of a repeating unit that includes a carboxyl group and a repeating unit that includes a sulfonic acid group.

8. The resist pattern-forming method according to claim 3, wherein the fluorine-containing resin comprises at least one of a repeating unit that includes a group shown by a following general formula (1) and a repeating unit that includes a group shown by a following general formula (2), (1)

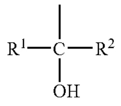

(2)

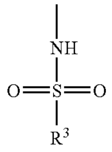

wherein each of $R^1$ and $R^2$ represents at least one of a hydrogen atom, an alkyl group having 1 to 4 carbon atoms, and a fluoroalkyl group having 1 to 4 carbon atoms wherein at least one of $R^1$ and $R^2$ represents a fluoroalkyl group having 1 to 4 carbon atoms, and $R^3$ represents a linear or branched alkyl group having 1 to 10 carbon atoms wherein at least one hydrogen atom is substituted with a fluorine atom.

9. The resist pattern-forming method according to claim 5, wherein the fluorine-containing resin further includes at least one of a repeating unit that includes a carboxyl group and a repeating unit that includes a sulfonic acid group.

10. The resist pattern-forming method according to claim 6, wherein the fluorine-containing resin further includes at least one of a repeating unit that includes a carboxyl group and a repeating unit that includes a sulfonic acid group.

11. The resist pattern-forming method according to claim 8, wherein the fluorine-containing resin further includes at least one of a repeating unit that includes a carboxyl group and a repeating unit that includes a sulfonic acid group.

* * * * *

UNITED STATES PATENT AND TRADEMARK OFFICE

CERTIFICATE OF CORRECTION

PATENT NO. : 8,206,894 B2
APPLICATION NO. : 12/841988
DATED : June 26, 2012
INVENTOR(S) : Takayoshi Abe, Atsushi Nakamura and Gouji Wakamatsu It is certified that error appears in the above-identified patent and that said Letters Patent is hereby corrected as shown below:

Title page should include the following:

(73) Assignee: JSR Corporation, Tokyo (JP)

Signed and Sealed this
Twenty-third Day of October, 2012

David J. Kappos
*Director of the United States Patent and Trademark Office*